United States Patent
Mistry et al.

[11] Patent Number: 5,832,988
[45] Date of Patent: Nov. 10, 1998

[54] HEAT EXCHANGER FOR OUTDOOR EQUIPMENT ENCLOSURES

[75] Inventors: Mahesh B. Mistry, Parsippany, N.J.; Robert Edwin Slothower, Omaha, Nebr.

[73] Assignee: Lucent Technologies, Inc., Murray Hill, N.J.

[21] Appl. No.: 907,068

[22] Filed: Aug. 6, 1997

[51] Int. Cl.⁶ .................................................. H05K 7/20
[52] U.S. Cl. ............... 165/103; 165/104.33; 165/104.34; 165/154; 361/696
[58] Field of Search .................................... 165/100, 102, 165/103, 104.33, 104.34, 154, 121, 122; 361/695, 696

[56] References Cited

U.S. PATENT DOCUMENTS

| | | | |
|---|---|---|---|
| 895,550 | 8/1908 | Fullerton | 165/103 |
| 1,278,035 | 9/1918 | Sexton | 165/102 |
| 2,067,560 | 1/1937 | Bollheimer | 165/102 X |
| 2,823,026 | 2/1958 | D'Amico et al. | 165/154 |
| 2,903,247 | 9/1959 | Kritzer | 165/154 |
| 5,361,188 | 11/1994 | Kondou et al. | 361/695 |
| 5,424,925 | 6/1995 | Katooka et al. | 361/695 |
| 5,570,740 | 11/1996 | Flores et al. | 165/104.34 |

FOREIGN PATENT DOCUMENTS

| | | | |
|---|---|---|---|
| 2-205397 | 8/1990 | Japan | 361/695 |
| 4-170097 | 6/1992 | Japan | 361/696 |
| 6-21677 | 1/1994 | Japan | 361/695 |

OTHER PUBLICATIONS

Bradley et al., Gas/Gas Heat Exchange IBM Tech. Disclosure Bulletin vol. 13 No. 8 p. 2177, Jan. 1971.

*Primary Examiner*—Allen J. Flanigan

[57] ABSTRACT

A cooling system for an outdoor equipment enclosure includes a nested columnar heat exchanger used in combination with a diverter for controlling the flow of outdoor air. The heat exchanger includes an interior column coupled to a upper exhaust fan for drawing outside air upward through the enclosure. An outer column, formed to surround the interior column, provides a path for interior air flow. The diverter is positioned between the main equipment compartment and an underlying battery compartment. During the period of time that the outdoor air is warmer than the air in the battery compartment, the diverter guides the outdoor air directly into the heat exchanger. When the outdoor temperature drops, the diverter closes off this path and instead forces the outdoor air through the battery compartment and then into the heat exchanger, thereby cooling off the batteries as well as lowering the temperature in the main equipment enclosure.

6 Claims, 2 Drawing Sheets

HEAT EXCHANGER FOR OUTDOOR EQUIPMENT ENCLOSURES

BACKGROUND OF THE INVENTION

1. Technical Field

The present invention relates to a heat exchanger for use in outdoor equipment enclosures and, more particularly, to a simplified nested columnar heat exchanger configuration that may be formed of an extruded material.

2. Description of the Prior Art

There are many types of electronic equipment that, of necessity, must be located in an outdoor environment. For example, telecommunications equipment and cable television equipment ("communications equipment", generally speaking) are often housed in enclosures located in the outdoors. In the communications industry, such equipment is often referred to as "outside plant equipment". The included equipment is known to generate a great deal of heat, where this heat must be dissipated to prolong the life of the equipment. Further, in many environments the outside "ambient" air can become very warm, heating up the enclosure (usually referred to as a cabinet), where the heated cabinet will, in turn, heat up the internal air and further exacerbate heat problems related to equipment operation.

There are air conditioning systems available in the prior art that may be used in conjunction with outside plant equipment to aid in maintaining a constant temperature environment for the communications equipment. However, the air conditioning systems may not be cost effective for all applications. An alternative approach is disclosed in U.S. Pat. No. 5,570,740, issued to M. A. Flores et al. on Nov. 6, 1996, which discloses a built-in cooling system for an enclosure. The Flores et al. cooling system utilizes a combination of a heat exchanger and a plenum to provide for flow of both "internal air" and "external air". The heat exchanger is formed to include a serpentine internal structure to maintain separation between the air flows. The external air enters at the bottom of the exchanger and is pulled upward and through the plenum. The internal air enters an opening near the top of the exchanger and is pulled downward through a fan located near the bottom of the heat exchanger. The serpentine structure of the exchanger is constructed to allow for a large amount of heat exchange between the relatively cool upward external air flow and the relatively warm downward internal air flow.

Although the Flores et al. cooling system is very effective in obtaining the desired result, the exchanger unit is of a complicated design that may not be suitable for all purposes. Thus, a need remains in the art for a relatively simple, cost effective arrangement for providing the needed cooling to outside equipment enclosures while occupying less space than conventional cooling arrangements.

SUMMARY OF THE INVENTION

The need remaining in the prior art is addressed by the present invention, which relates to a heat exchanger for use in outdoor equipment enclosures and, more particularly, to a simplified nested columnar heat exchanger configuration that may be formed of an extruded material. The heat exchanger comprises an internal air flow column that receives the outside air flow and a surrounding air flow column that functions to circulate the interior air. A fan unit is coupled to the top of the internal column to draw the external air upwards and exhaust this air through a plenum structure.

In a preferred embodiment of the present invention, a diversion means is coupled to the entrance of the internal column and functions to switch between two sources of external air, as a function of the difference in temperature between the outdoor air and the air in the underlying battery compartment. In particular, when the outdoor air is warmer than the air surrounding the batteries, the outdoor air is directed through the internal column and the diversion means blocks off the air flow from the battery compartment. When the outdoor air is cooler than the air surrounding the batteries, the diversion means blocks the entry of outdoor air into the internal column and diverts the outdoor air through the battery compartment and subsequently into the internal column. Thus, the cool outdoor air serves the additional function of cooling off the associated batteries, thereby extending battery life. The air flow past the batteries is then pulled up through the internal column and exhausted through the upper plenum structure. Advantageously, the heat exchanger of the present invention is capable of being easily integrated with existing outdoor equipment enclosures.

Various other features and embodiments of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
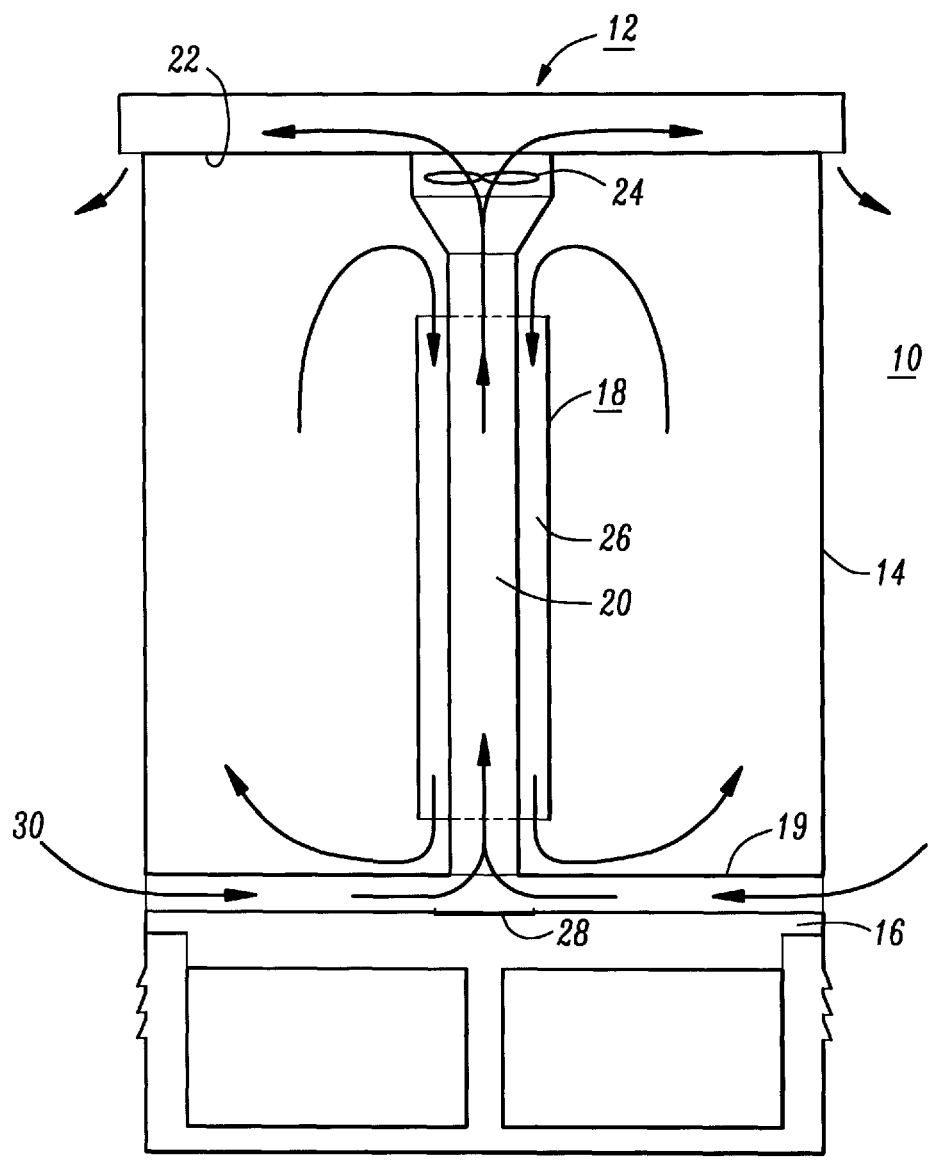
FIG. 1 illustrates a first configuration of the exchanger of the present invention, where the diversion means is positioned such that the outdoor air directly enters the interior column of the exchanger.

An exemplary cabinet 10 including a cooling system 12 of the present invention is illustrated in FIG. 1. It is to be understood that the cabinet, when used, is filled with various electronic components, where these components are not illustrated for the sake of clarity in reviewing the drawings and understanding the concepts associated with the teachings of the present invention. In general, cabinet 10 includes a main section 14 for housing the electronic equipment and a battery chamber 16 formed as a separate area underneath the floor 19 of main section 14.

In accordance with the present invention, cooling system 12 comprises a heat exchanger 18 that includes an interior column 20 that extends between floor 19 and ceiling 22. A fan unit 24 is coupled to the top portion of column 20 and functions to draw the air flow upwards and exhaust the air through top section 25, which may comprise a plenum structure. Heat exchanger 18 also includes an outer column 26 that is disposed to surround interior column 20. As mentioned above, the configuration of FIG. 1 is associated with the operation of the inventive heat exchanger when the outside air temperature is greater than the ambient air temperature in battery chamber 16. In this configuration, deflection means 28 is positioned to block the flow of air through battery chamber 16 and instead directly draws the outdoor air through ventilation louvers 30.

When fan unit 24 is turned "on", the relatively warm outdoor air is drawn upward through interior column 20 of heat exchanger 18 and exhausted through top section 25. The interior cabinet air flows in an opposite direction, as indicated by the arrows, entering at the top of outer column 26 and exiting through the bottom. The movement of the interior air in the indicated direction is controlling by the existing fans associated with the enclosed electronic equipment (indicated in phantom in the illustration). Advantageously, therefore, there is no need to provide additional fans for moving the interior air. The nested columnar structure of heat exchanger 18 maintains the required separation between the two air flows, yet allows for a significant heat transfer to occur such that the warmer air will be exhausted through the top of cabinet 10. Advantageously, the nested columnar structure may comprise an extruded aluminum unit that is both cost effective and easy to install.

Figure 2:
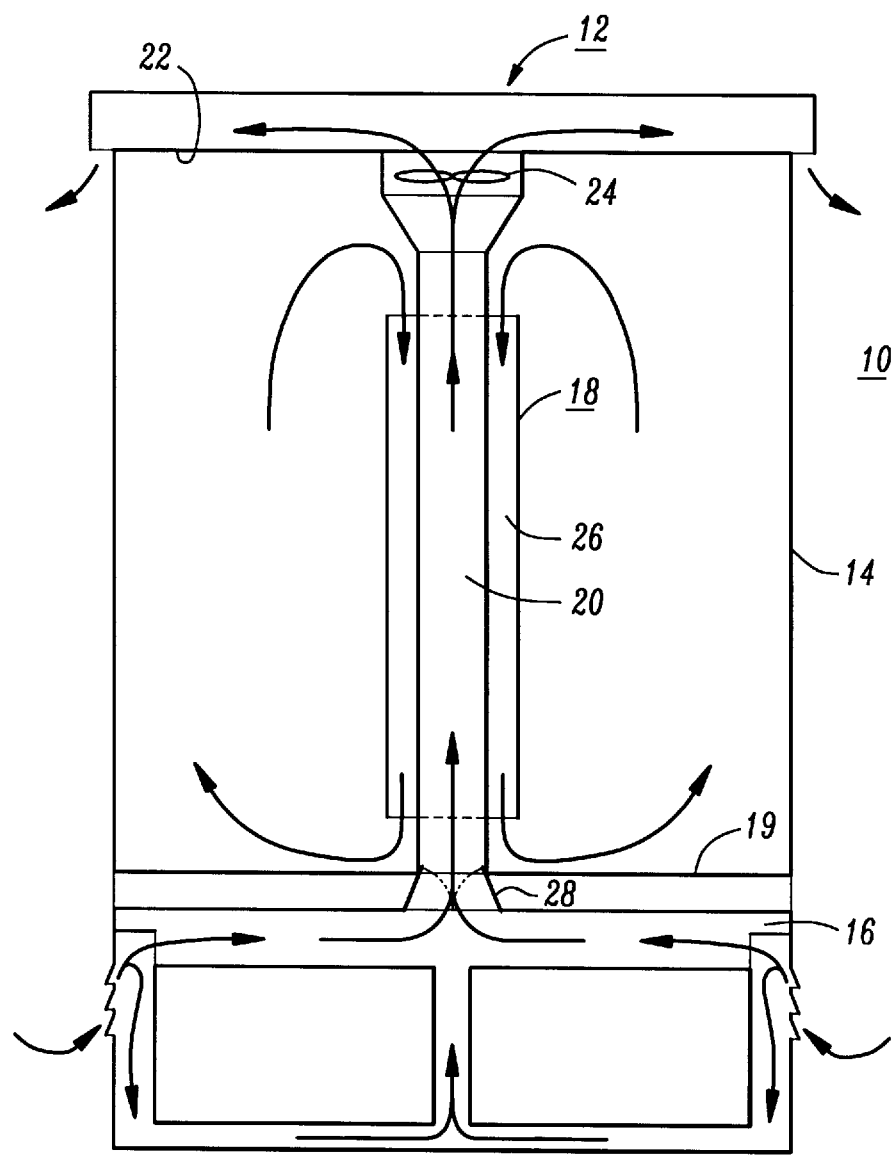
FIG. 2 illustrates a second configuration of the exchanger of the present invention, where the diversion means is positioned such that the outdoor air first passes through the battery chamber and the battery chamber air is exhausted through the interior exchange column.

The alternative air flow configuration of the heat exchanger of the present invention is illustrated in FIG. 2. The various components are identical to those described above and need not be reviewed in detail. As shown in FIG. 2, diversion means 28 has been repositioned to block the flow of outdoor air into the cabinet and, instead, brings the flow of outdoor air through louvers 32 and into battery chamber 16, and subsequently into interior column 20 of heat exchanger 18. The illustrated configuration is suitable for use during the period of time that the outdoor air is cooler than the temperature inside battery chamber 16 (e.g., at night). The diverted flow of the outdoor air thus first functions to cool down the batteries (extending battery life) and exhaust the heated air from the battery chamber through the top of the cabinet. The heat exchange within the main cabinet section 14 occurs in the same manner as discussed above. That is, the heat is transferred from the interior air passing through outer column 26 into the air passing upward through interior column 20.

The activation of diversion means 28 may be controlled in any suitable fashion. For example, diversion means 28 may include a thermostat and relay that operate to close off the battery cabinet when the outdoor temperature is greater than the battery temperature (the position illustrated in FIG. 1) and open the air flow between the outdoor air, battery cabinet and interior column when the outdoor temperature is less than the battery temperature (the position illustrated in FIG. 2). Alternatively, a simple timer may be used to control the position of diversion means 28, based on statistical data related to outdoor air temperature and battery chamber temperature during a typical twenty-four hour period. Obviously, any such timer arrangement would have to be adjusted during the course of the year to remain at maximum efficiency.

What is claimed is:

1. A cooling system for use with an outdoor equipment enclosure, said enclosure comprising a main section for housing electronic equipment and a battery section for housing a power supply, the cooling system comprising a heat exchanger disposed within the main section and comprising an interior column including an inlet port and an exhaust port for upwardly exhausting outdoor air, and an outer column positioned to surround the interior column for creating an air flow path for the main section interior air, the heat exchanger also comprising a fan unit coupled to the exhaust port of the interior column for creating an upward air flow path for the outdoor air; and diversion means coupled between the main section and the battery section, said diversion means having a first position for blocking air flow through said battery section and guiding the flow of outdoor air directly into the inlet port of the interior column of the heat exchanger and a second position for blocking the direct flow of outdoor air into the inlet port and guiding the flow of outdoor air through the battery section and subsequently into the inlet port of the heat exchanger interior column.

2. The cooling system as defined in claim 1 wherein the diversion means is placed in its first position when the outdoor air temperature is greater than the temperature in the battery section and placed in its second position when the outdoor air temperature is less than the temperature in the battery section.

3. The cooling system as defined in claim 2 wherein the diversion means utilizes a thermostat and relay arrangement to control the movement of the diversion means between the first position and the second position.

4. The cooling system as defined in claim 1 wherein the diversion means includes a timer to control the movement of said diversion means between the first position and the second position.

5. The cooling system as defined in claim 1 wherein the heat exchanger is formed of an extruded material.

6. The cooling system as defined in claim 5 wherein the extruded heat exchanger is aluminum.

* * * * *